United States Patent
Lim

(10) Patent No.: US 8,000,145 B2
(45) Date of Patent: Aug. 16, 2011

(54) METHOD FOR PROGRAMMING NAND TYPE FLASH MEMORY

(75) Inventor: Se Yun Lim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 128 days.

(21) Appl. No.: 12/494,531

(22) Filed: Jun. 30, 2009

(65) Prior Publication Data

US 2010/0074017 A1   Mar. 25, 2010

(30) Foreign Application Priority Data

Sep. 24, 2008   (KR) .................. 10-2008-0093842

(51) Int. Cl.
 *G11C 11/34* (2006.01)
(52) U.S. Cl. .......... 365/185.17; 365/185.23; 365/185.01
(58) Field of Classification Search ............. 365/185.17, 365/185.23, 185.01
See application file for complete search history.

(56) References Cited

U.S. PATENT DOCUMENTS

| | | | | |
|---|---|---|---|---|
| 5,687,121 A | * | 11/1997 | Lee et al. | 365/185.11 |
| 2006/0120155 A1 | * | 6/2006 | Sato et al. | 365/185.17 |
| 2008/0037327 A1 | | 2/2008 | Park et al. | |
| 2009/0109751 A1 | | 4/2009 | Aritome | |
| 2009/0287879 A1 | * | 11/2009 | Oh et al. | 711/103 |

FOREIGN PATENT DOCUMENTS

| | | |
|---|---|---|
| JP | 2007-087526 | 4/2007 |
| KR | 10-2006-0005603 | 1/2006 |

* cited by examiner

*Primary Examiner* — Vu A Le
*Assistant Examiner* — Han Yang
(74) *Attorney, Agent, or Firm* — Marshall, Gerstein & Borun LLP

(57) ABSTRACT

Disclosed is a method for programming a flash memory device capable of preventing a threshold voltage distribution of a memory cell from being moved due to a pass disturbance of the memory cell programmed initially at a program operation performed on a page-unit basis. The method for programming a NAND flash memory device including a plurality of cell strings having N memory cells connected, in which gates of the memory cells are connected to a word line, the method is performed by applying a program voltage to at least two word lines simultaneously including a selected word line.

12 Claims, 5 Drawing Sheets

METHOD FOR PROGRAMMING NAND TYPE FLASH MEMORY

CROSS-REFERENCE TO RELATED APPLICATION

The present application claims priority to Korean application number 10-2008-0093842, filed on Sep. 24, 2008, which is incorporated by reference in its entirety.

BACKGROUND OF THE INVENTION

The present disclosure relates to a method for driving flash memory devices, and more particularly to a method for programming NAND flash memory devices.

Generally, a semiconductor device used for storing data can be classified into a volatile memory device and a non-volatile memory device. The volatile memory device loses the stored data as the power supply is interrupted, whereas the non-volatile memory device maintains the stored data even though the power supply is interrupted. Therefore, the non-volatile memory device is widely used under a circumstance that the power source can not be always used and is often interrupted, such as a mobile phone system, a memory card used for storing music and/or video data or other application devices, or when a low power is required to be used. A representative example of such non-volatile memory device can be exemplified by a flash memory device.

The flash memory device is classified into a floating gate-type and a charge trap-type in accordance with a kind of a storage layer. The floating gate-type flash memory accumulates charges into a floating gate and the charge trap-type flash memory accumulates charges in a trap site which exists in a charge trap layer such as Silicone Nitride (SiN).

The charge trap-type flash memory device has a SONOS-type structure in which a tunneling layer of oxide film, a charge trap layer of Nitride film, a blocking layer of oxide film and a control gate electrode of poly-silicon film are laminated on a semiconductor substrate in order; or a MANOS-type structure in which a tunneling layer of oxide film, a charge trap layer of nitride film, a blocking layer of aluminum oxide film and a control gate electrode of metal are laminated on the semiconductor substrate in order.

The charge trap-type flash memory device which has been widely used is programmed on a page-unit basis sequentially from a first word line WL0 to a last word line WL31 if it has, for example, 32 cell strings. However, since the first word line WL0 programmed initially is operated in a program inhibit mode while other word lines are programmed, a change in a threshold voltage is caused due to a pass disturbance.

FIG. 1 is a circuit diagram showing a NAND flash memory device illustrating a prior program method, and FIG. 2 is a graph illustrating the change in the threshold voltage of the programmed memory cell as caused by the pass disturbance.

Referring to FIG. 1, the memory cell array is configured with a plurality of cell strings connected to a bit line BL. The cell string is consisted of a source select transistor 110, a plurality of memory cell transistors 131~136, and a drain select transistor 120. The source select transistors 110 have gates connected to a source select line SSL in common and the drain select transistors 120 have gates connected to a drain select line DSL in common. The memory cell transistors 131~136 have control gates connected to the word lines WL0~WL31. The memory cell transistors 131~136 are connected in series between the source select transistor 110 and the drain select transistor 120. The number of the memory cells included within a single cell string is 32 as shown or the number can be changed depending on a storage capacity of the memory device. The source select transistor 110 and the drain select transistor 120 are a typical MOS transistor and the memory cell transistors 131~136 are charge trap-type transistors.

The program of the memory cells is proceeded on a page-unit basis sequentially from the memory cell 131 connected to the first word line WL0 to the memory cell 136 connected to the last word line WL31. For example, when programming the memory cell 132 connected to the second word line WL1 after programming the memory cell connected to the first word line WL0, a program voltage Vpgm is applied to the word line of the memory cell 132 to be programmed and a pass voltage Vpass is applied to remaining word lines. At this time, the memory cell 131 connected to the first word line which is already programmed is operated in the program inhibit mode so that the threshold voltage distribution 210 is gradually moved rightward, as shown in FIG. 2. To the memory cell 131 which is initially programmed, the pass voltage is applied 31 times so that the memory cell 131 is substantially subject to the pass disturbance, which results that the threshold voltage distribution is largely moved. Because a correct verification is not performed in a program verification step if the threshold voltage distribution of the memory cell moves, the program fail can be encountered which is not capable of being programmed in a desirable level and the data can not be correctly read out in a read operation.

SUMMARY OF THE INVENTION

Embodiments of the present disclosure are directed to providing a method for programming a flash memory device which is capable of preventing a threshold voltage distribution of other memory cells from being moved due to a pass disturbance of a memory cell which is initially programmed, at a program operation performed on a page-unit basis.

The method for programming a flash memory device according to an embodiment of the present invention is characterized in that a method for programming a NAND flash memory device including a plurality of cell strings having N memory cells connected, in which gates of the memory cells are connected to a word line, wherein the method is performed by applying a program voltage to at least two word lines simultaneously.

Two adjacent word lines of the word lines may be programmed simultaneously, or at least two word lines may be programmed sequentially from a first word line of the word lines. Further, the word lines may be programmed in order of a pair of a first word line and an Nth word line and a pair of a second word line and an N-1th word line.

The method for programming a flash memory device according to other embodiments of the present disclosure is characterized in that a method for programming a NAND flash memory device including a plurality of cell strings having N memory cells are connected, in which gates of the memory cells are connected to a word line, comprising steps of applying a program voltage to at least two word lines simultaneously and a pass voltage to the remaining word lines; verifying whether the memory cell of the word line to which the program voltage is applied is programmed at a target level; and applying the program voltage to the word line not passing the verification until it passes the verification, so that the program may be finished if all the word lines pass the verification.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, exemplary embodiments of the present disclosure will be described with reference to accompanying drawings. However, the embodiments are for illustrative purposes only and are not intend to limit the scope of the disclosure.

Figure 1:
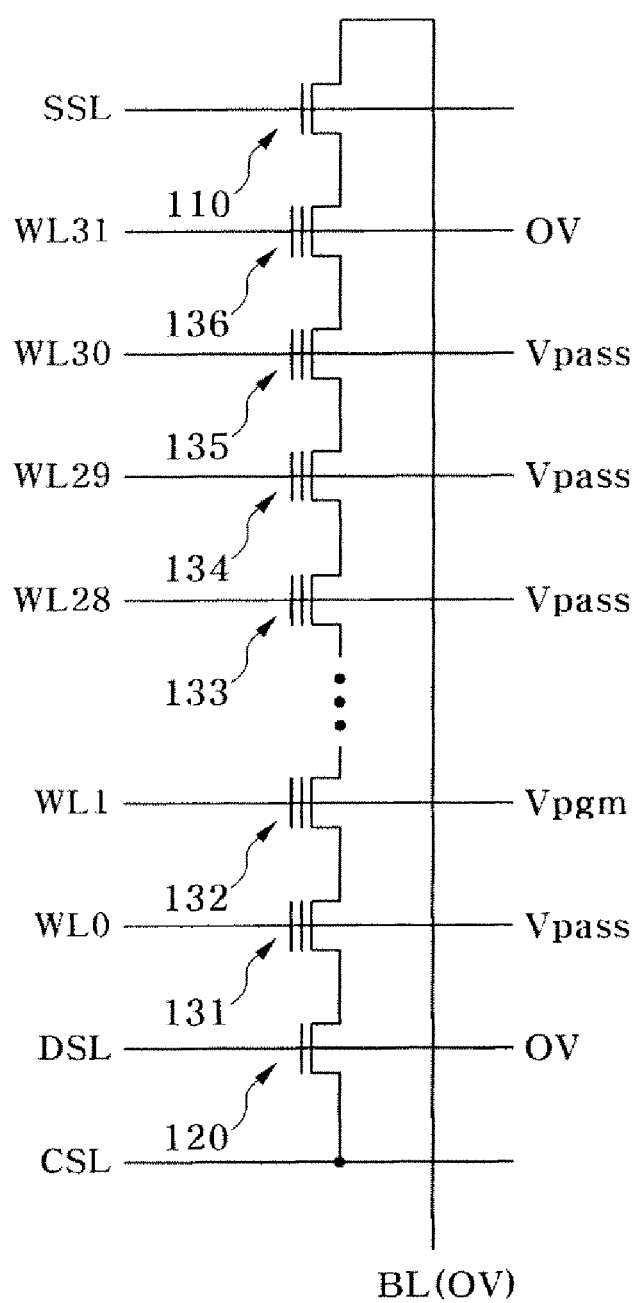
FIG. 1 is an equivalent circuit diagram of a NAND flash memory device illustrating a conventional program method.
Figure 2:
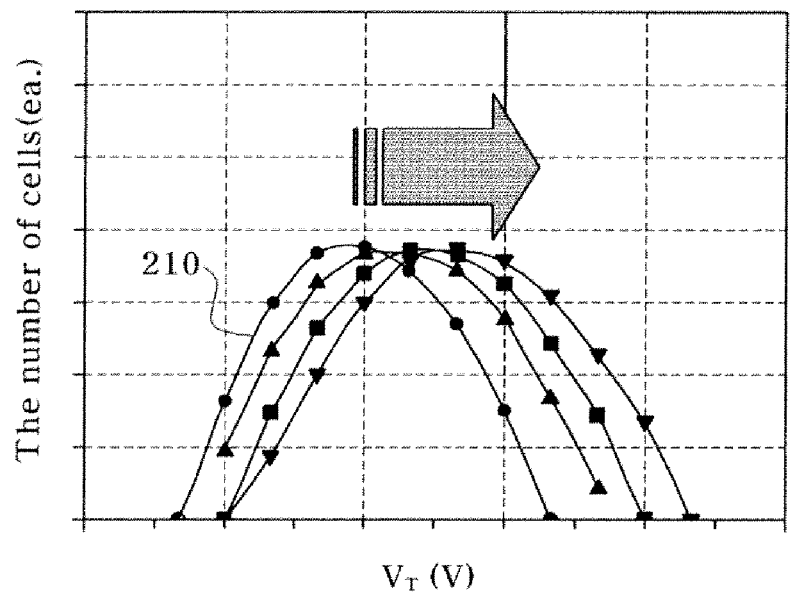
FIG. 2 is a graph illustrating a change in a threshold voltage of the programmed memory cell caused due to a pass disturbance.
Figure 3:
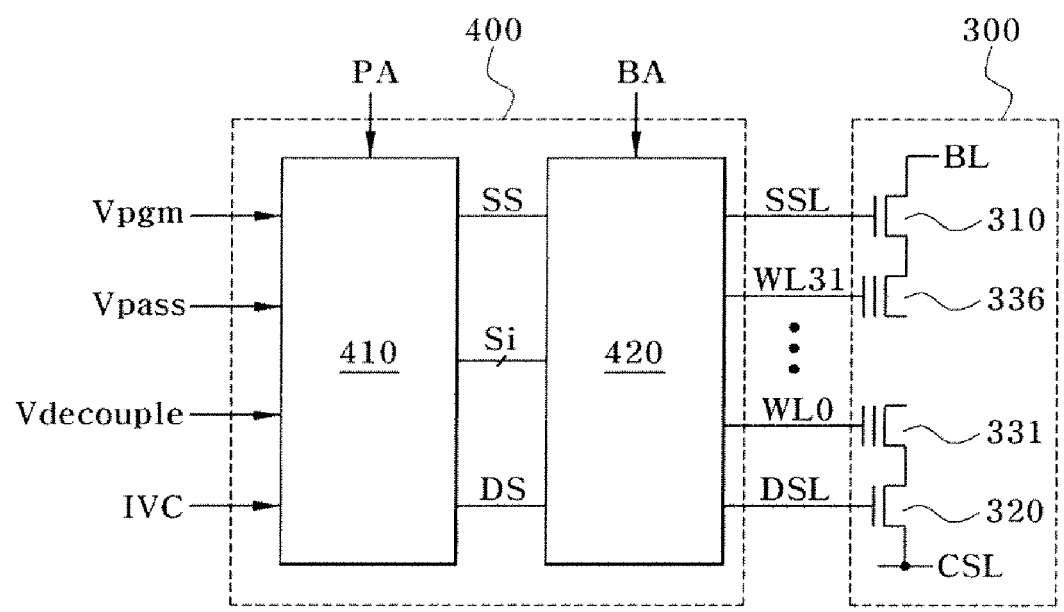
FIG. 3 is a circuit block diagram illustrating a program operation of the flash memory device according to the present disclosure.

FIG. 3 is a circuit block diagram illustrating a program operation of a flash memory device according to the present disclosure.

Referring to FIG. 3, the flash memory device includes a memory cell array 300 used for storing data. The memory cell array 300 is consisted of a plurality of memory blocks. The memory cell array 300 includes a plurality of strings, in which each string is consisted of a source select transistor 310 connected to a bit line BL, a drain select transistor 320 connected to a common source line, and memory cells 331, 336 connected in series between the select transistors 310, 320. The source select transistors 310, the memory cells 331, 332 and the drain select transistor 320 are connected to a source select line SSL, word lines WL0, WL31, and a drain select line DSL respectively.

The flash memory device includes a column select block 400 consisting of a first decoding and driving circuit 410 and a second decoding and driving circuit 420. The column select block 400 is supplied with a pass voltage Vpass and a program voltage Vpgm from a word line voltage generating circuit (not shown) and supplies the program voltage Vpgm or the pass voltage Vpass to the word lines WL0~WL3 under a control of a control logic circuit (not shown). For example, during a program operation, the column select block 400 drives the word lines WO0~WL31 with the pass voltage Vpass and drives the word line selected with the program voltage Vpgm after a prescribed time. The column select block 400 includes a first decoding and driving circuit 410 and a second decoding and driving circuit 420. The first decoding and driving circuit 410 is inputted with a program voltage Vpgm, the pass voltage Vpass and a page address PA, and drives select lines Si with the voltages Vpass, Vpgm inputted and select lines DS, SS with a predetermined voltage, e.g., a power source voltage, a ground voltage or a read voltage, under a control of the control logic circuit (not shown). The select lines Si correspond to word lines WL0~WL31 respectively. The second decoding and driving circuit 420 is inputted with a block address BA and electrically connects the select lines Si to corresponding word lines WL0~WL31 and the select lines SS, DS to the source and drain select lines SSL, DSL, under a control of the control logic circuit (not shown).

Figure 4:
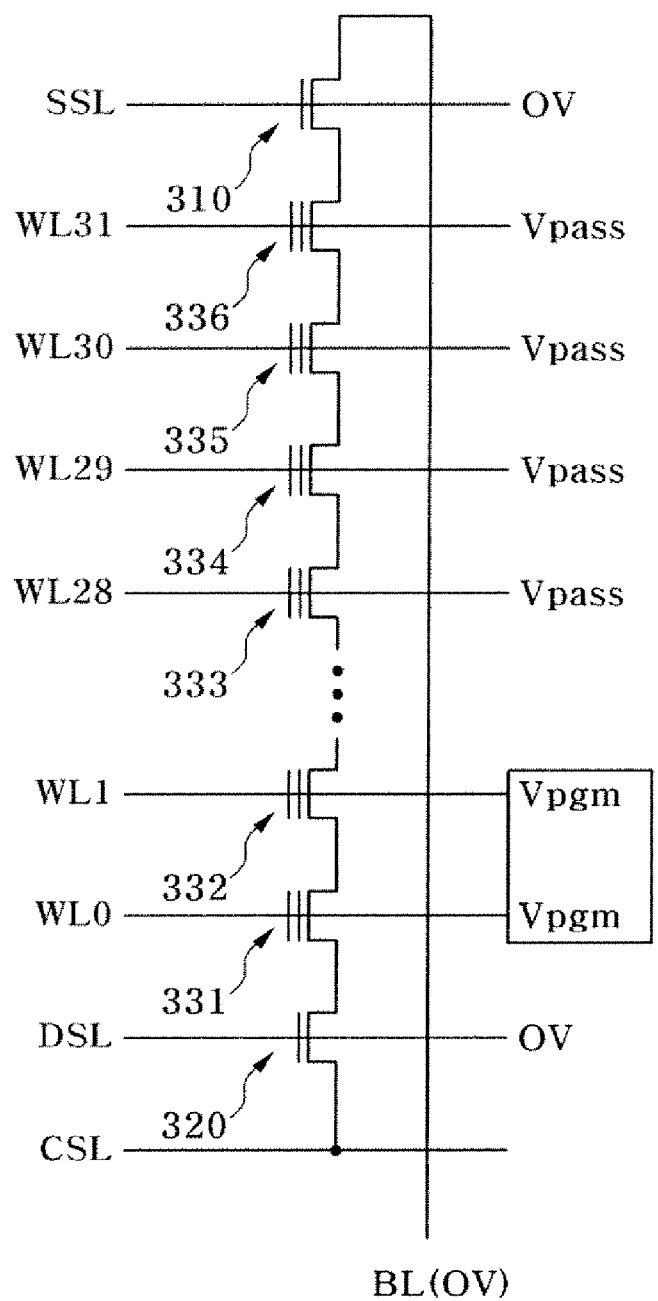
FIG. 4 is an equivalent circuit diagram illustrating a program method of the flash memory device according to the present disclosure.

FIG. 4 is an equivalent circuit diagram illustrating a program method of the flash memory device according to the present disclosure.

Referring to FIG. 4, the memory cell array includes a plurality of cell strings connected to the bit line BL. The cell string has a source select transistor 310, a plurality of memory cell transistors 331~336 and a drain select transistor 320. The source select transistor 310 has a gate connected to the source select line SSL in common and the drain select transistor 320 has a gate connected to the drain select line DSL. The memory cell transistors 331~336 has control gates connected to the word lines WL0~WL31. The memory cell transistors 331~336 are connected in series between the source select transistor 310 and the drain select transistor 320. The number of the memory cells included in a single string is 32 as shown or can be dependent on a storage capacity of the memory device.

According to the present disclosure, at least two word lines are programmed at the same time, differently from prior art in that each page is programmed, in order to make the threshold voltage distribution of the memory cell uniform and narrow. In one embodiment of the present disclosure, it will be described on programming two pages respectively. In other words, the present disclosure uses 2-page program method which programs two word lines simultaneously.

For example, in order to program the first word line WL0 and the second word line WL1, the program voltage Vpgm is applied to the word line WL0 and the word line WL1 at the same time and the pass voltage Vpass is applied to remaining word lines WL2~WL31. The ground voltage or 0V is applied to the source select line SS1 and the drain select line DSL. The program voltage is applied 31 times for the word line WL0 according to prior art, whereas the program bias is applied 15 times at the maximum even in the case of the word line that is applied with the maximum program bias when programming two word lines at the same time according to the present disclosure. Therefore, since the program bias is applied 50% less than the prior art, the pass disturbance can be reduced at least 50%.

The program method of the present disclosure will be described specifically referring to flow charts of FIG. 5a and FIG. 5b.

Figure 5A:
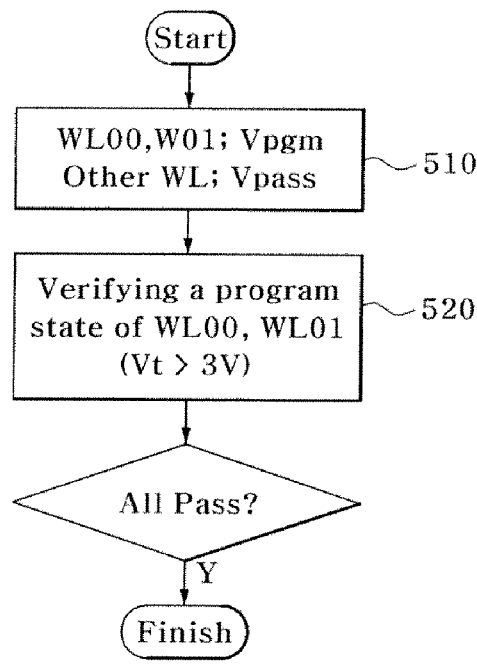
FIGS. 5a and 5b are flow charts illustrating a program method according to the present disclosure.
Figure 5B:
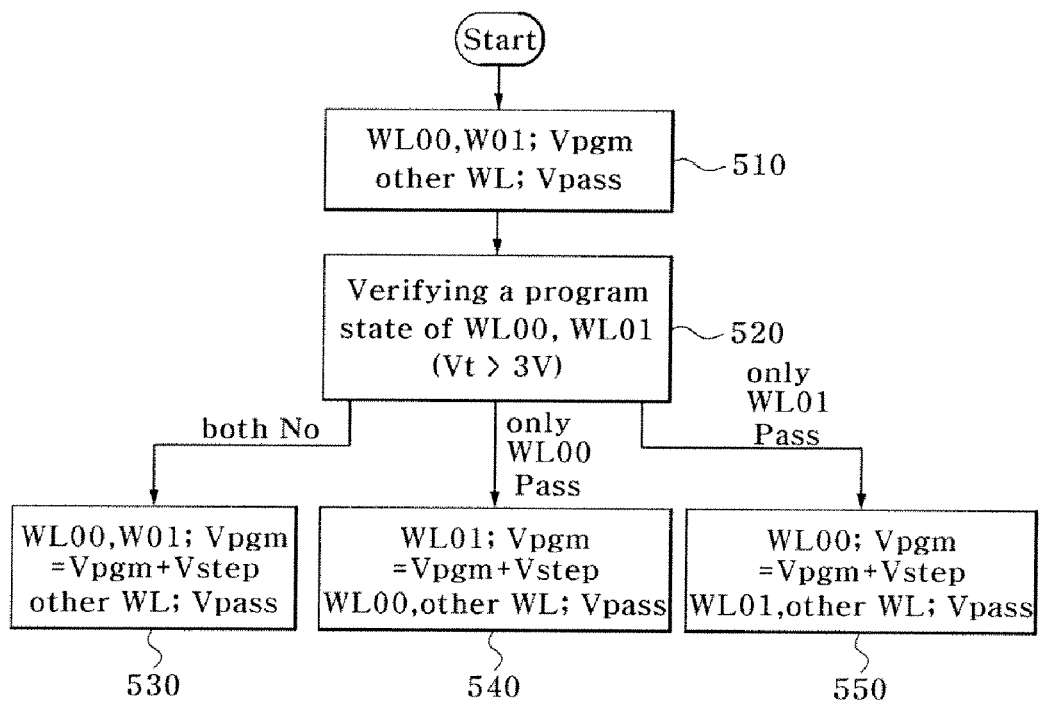

FIG. 5a and FIG. 5b are flowcharts illustrating the program method according to the present disclosure. It will be described on programming a pair of the word lines WL00 and WL01 to have the threshold voltage of 3V.

Referring to FIG. 5a and FIG. 5b, the program voltage Vpgm is applied to each of word lines WL00 and WL01 to be programmed and the pass voltage Vpass is applied to remaining word lines (block 510). The program voltage Vpgm and the pass voltage Vpass can depend on a property of the memory device and a level of the program respectively, in which the program voltage Vpgm can be about 10~30V and the pass voltage Vpass can be about 1~15V.

After applying the program voltage, a verification is carried out to verify whether the memory cell is programmed to have a target threshold voltage (block 520). The verification is performed respectively for two word lines, in which the first word line WL00 is verified and then the second word line WL01 is verified. The verification operation is performed in such a way to verify whether the threshold voltage Vt is greater than the verification voltage, for example, 3V by scanning the threshold voltage Vt of the memory cell which applies the program voltage. If the threshold voltage Vt of the memory cell is greater than a verification voltage, i.e., 3V, it is determined to pass the verification. The verification voltage can be used with less than about 10V.

FIG. 5a shows a case in that the memory cells of the two word lines WL00, WL01 pass the verification. If all the two word lines pass the verification, the word lines WL00, WL01 is finished being programmed. However, if any one word line of the word lines WL00, WL01 does not pass the verification, the blocks 530 to 550 in FIG. 5b are proceeded.

Referring to FIG. 5b, as a result of carrying out the verification (block 520), if all of the two word lines WL00, WL01 does not pass it, the word lines WL00, WL01 are applied with the program voltage increased by the step voltage Vstep, for example, 0.3V and the remaining word lines are applied with the pass voltage Vpass (block 530).

If only one word line of two word lines WL00, WL01 passes the verification, the one word line is not programmed any more and the other word line is repeated with the program/verification until it has the target threshold voltage. In other words, only the word line not passing the verification is programmed by applying the program voltage increased by the step voltage Vstep. The word line passing the verification and the other word lines non-selected are applied with the pass voltage Vpass.

For example, if only word line WL00 passes the verification, the word line WL01 not passing the verification is applied with the program voltage increased by the step voltage Vstep, the word line WL00 and the remaining word lines are applied with the pass voltage Vpass to allow it not to be programmed (step 540). And, if only word line WL01 passes the verification, the word line WL00 not passing the verification is applied with the program voltage increased by the step voltage Vstep and the word line WL01 and the remaining word line are applied with the pass voltage Vpass to allow it not to be programmed (block 550).

After applying the program voltage or the pass voltage, it returns to the verification step S520 to verify the program state of the memory cell, and it allows the program to be finished or the steps 530 to 550 to be proceeded in accordance with the program state of each word line.

Though the embodiment shows a case of programming sequentially such as a pair of the word lines WL00 and WL01, the word lines can be programmed in an order such as a pair of word lines WL00 and WL31 and a pair of word lines WL01 and WL30. Further, though the embodiment shows a case of connecting 32 memory cells to one cell string in the embodiment, there is no problem in applying a concept of the present disclosure even though the number of memory cells is different. Further, it is possible to program two word lines, as well as more than two word lines at the same time according to the present disclosure.

Figure 6:
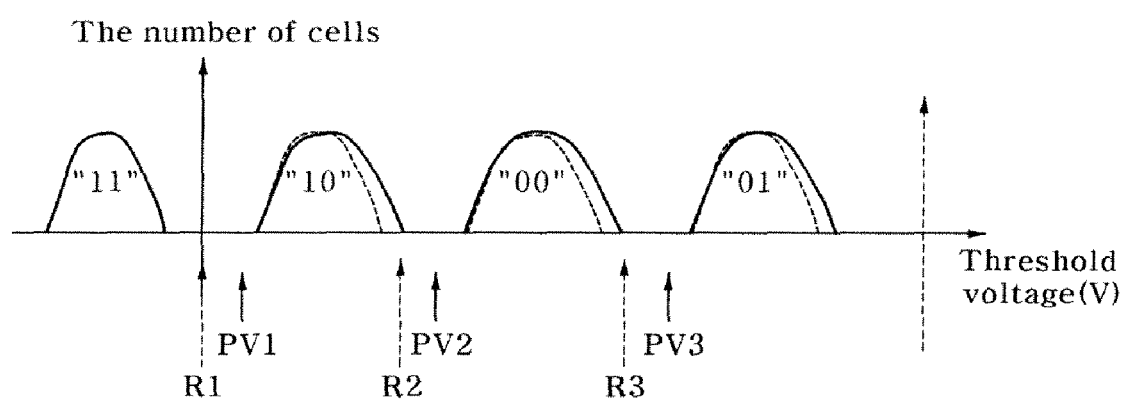
FIG. 6 is a graph illustrating a threshold voltage distribution of the memory cell made narrow when being programmed by the program method according to the present disclosure.

FIG. 6 is a graph showing that a threshold voltage of the memory cell is made narrow when being programmed by the programming method according to the present disclosure.

In the drawing, a solid line indicates the threshold voltage distribution when being programmed according to a prior method; and a dotted line indicates the threshold voltage distribution when being programmed according to the present disclosure. As shown, since the pass disturbance is reduced when being programmed according to the present disclosure, a right tail in the threshold voltage distribution of the memory cell is reduced. Therefore, it is possible to assure a margin of the read line and make lower the verification line, thereby to prohibit an operation failure.

According to the program method of the flash memory device according to the present disclosure, since the pass disturbance is reduced, the right tail in the threshold voltage distribution of the memory cell is reduced. Therefore, it is possible to assure a margin of the read line and make lower the verification line, thereby to prohibit the operation failure.

The embodiments of the present disclosure have been disclosed above for illustrative purposes. Those skilled in the art will appreciate that various modifications, additions and substitutions are possible, without departing from the scope and spirit of the invention as disclosed in the accompanying claims.

What is claimed is:

1. A method for programming a NAND flash memory device including a plurality of cell strings having N memory cells connected, in which gates of the memory cells are connected to word lines, the method comprising:

applying a program voltage simultaneously to at least two word lines of the plurality of cell strings and a pass voltage to the remaining word lines; and, verifying that the at least two word lines to which the program voltage is applied are programmed at a target level.

2. The method for programming a NAND flash memory device according to claim 1, wherein the at least two word lines to which the program voltage is applied are two adjacent word lines.

3. The method for programming a NAND flash memory device according to claim 1, wherein the at least two word lines to which the program voltage is applied are programmed sequentially from a first word line of the word lines.

4. The method for programming a NAND flash memory device according to claim 1, wherein the word lines are programmed in order of a pair of a first word line and an Nth word line and a pair of a second word line and an N-1th word line.

5. A method for programming a NAND flash memory device including a plurality of cell strings having N memory cells connected, in which gates of the memory cells are connected to word lines, comprising:

applying a first program voltage simultaneously to at least two word lines of the plurality of cell strings and applying a pass voltage to the remaining word lines;

performing a first verification to a first word line of the at least two word lines to which the program voltage is applied to verify that the first word line is programmed at a target level;

performing a second verification to a second word line of the at least two word lines to which the program voltage is applied to verify that the second word line is programmed at a target level; and finishing the programming when the first and the second verifications are passed.

6. A method for programming a NAND flash memory device according to claim 5, further comprising:

repeating the programming and the first and the second verifications until the at least two word lines to which the program voltage is applied pass the first and the second verification by applying a second program voltage, wherein the second program voltage is added as a step voltage to the program voltage.

7. The method for the claim 6, wherein performing the first and second verifications comprises:

applying a verification pass voltage to the word lines that passed the first and second verifications while repeating the programming and the verifying operations.

8. The method for programming a NAND flash memory device according to claim 5, wherein the at least two word lines to which the first program voltage is applied are two adjacent word lines of the word lines.

9. The method for programming a NAND flash memory device according to claim 5, wherein the at least two word lines are programmed sequentially from a first word line of the word lines.

10. The method for programming a NAND flash memory device according to claim 5, wherein the word lines are programmed in order of a pair of a first word line and an Nth word line and a pair of a second word line and an N-1th word line.

11. The method for programming a NAND flash memory device according to claim 5, wherein the first and second verifications are performed sequentially.

12. The method for programming a NAND flash memory device according to claim 6, wherein a pass voltage is applied to the word lines that pass the first and the second verifications during repeating of the programming and the first and the second verifications.

* * * * *